(12) United States Patent
Ottens et al.

(10) Patent No.: US 7,630,060 B2
(45) Date of Patent: Dec. 8, 2009

(54) DEVICE MANUFACTURING METHOD, LITHOGRAPHIC APPARATUS AND DEVICE MANUFACTURED THEREBY

(75) Inventors: Joost Jeroen Ottens, Veldhoven (NL); Levinus Pieter Bakker, Helmond (NL); Wilhelmus Josephus Box, Eksel (BE); Jan Van Elp, Delft (NL); Frank Jeroen Pieter Schuurmans, Valkenswaard (NL); Jan Evert Van Der Werf, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 926 days.

(21) Appl. No.: 10/962,744

(22) Filed: Oct. 13, 2004

(65) Prior Publication Data

US 2008/0212053 A1 Sep. 4, 2008

(30) Foreign Application Priority Data

Oct. 16, 2003 (EP) ................... 03078271

(51) Int. Cl.
*G03B 27/32* (2006.01)
(52) U.S. Cl. .............................. 355/77; 355/53; 430/30
(58) Field of Classification Search .................. 355/53, 355/77; 430/30
See application file for complete search history.

(56) References Cited

U.S. PATENT DOCUMENTS

| 4,488,806 | A | * | 12/1984 | Takahashi et al. | ............. 355/77 |
|---|---|---|---|---|---|
| 5,311,282 | A | | 5/1994 | Someya et al. | |
| 5,617,182 | A | * | 4/1997 | Wakamoto et al. | ............. 355/53 |
| 5,715,063 | A | * | 2/1998 | Ota | ............. 356/400 |
| 6,266,144 | B1 | * | 7/2001 | Li | ............. 356/401 |
| 6,447,964 | B2 | | 9/2002 | Okino et al. | |
| 6,576,919 | B1 | | 6/2003 | Yoshida | |
| 6,798,491 | B2 | * | 9/2004 | Nishi et al. | ............. 355/53 |
| 2002/0166982 | A1 | * | 11/2002 | Kataoka et al. | ............. 250/548 |
| 2004/0076896 | A1 | * | 4/2004 | Kim et al. | ............. 430/30 |

FOREIGN PATENT DOCUMENTS

| JP | 06-045215 A | | 2/1994 |
|---|---|---|---|
| JP | 2000156336 A | * | 6/2000 |
| JP | 2001-319872 A | | 11/2001 |

OTHER PUBLICATIONS

Translation of Japanese Office Action dated Jan. 15, 2008 corresponding to Japanese Patent Application No. 2004-301690.

* cited by examiner

*Primary Examiner*—Diane I Lee
*Assistant Examiner*—Steven H Whitesell-Gordon
(74) *Attorney, Agent, or Firm*—Pillsbury Winthrop Shaw Pittman LLP

(57) ABSTRACT

A device manufacturing method is disclosed. The method includes patterning a beam of radiation, projecting the patterned beam of radiation onto a plurality of outer target portions of a substrate in a sequence in which each subsequent outer target portion is spaced-apart from a preceding outer target portion, and subsequent to projecting the patterned beam of radiation on the plurality of outer target portions, projecting the patterned beam of radiation onto an inner target portion of the substrate.

17 Claims, 4 Drawing Sheets

DEVICE MANUFACTURING METHOD, LITHOGRAPHIC APPARATUS AND DEVICE MANUFACTURED THEREBY

CROSS-REFERENCE TO RELATED APPLICATIONS

This application claims the benefit of priority from European Patent Application No. 3078271.8, filed Oct. 16, 2003, the entire content of which is incorporated herein by reference.

FIELD

The present invention relates to a device manufacturing method, a lithographic apparatus and a device manufactured thereby.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto target portions, including dies or die parts, on a substrate (e.g. a silicon wafer) that has a layer of radiation-sensitive material (resist). In general, a single substrate contains a network of target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

From the U.S. Pat. No. 6,447,964 patent, a charged particle beam microlithography method is known, in which regions of the substrate where entire dies are formed are exposed first, followed by regions—especially peripheral regions—with only portions of dies. Several exposure sequences are described for exposing the substrate, for example, a spiral sequence in which exposure of functional-device chips is performed in a spiral sequence, progressing inward, after which fragmentary chips, which typically surround the functional-device chips, are exposed.

SUMMARY

It is, therefore, an aspect of the present invention to provide an alternative to the known device manufacturing method in which devices may be made with high precision.

According to an aspect of the invention, there is provided a device manufacturing method, in which a substrate is provided, a projection beam of radiation is provided using an illumination system, and a patterning device is used to impart the projection beam with a pattern in its cross-section. The patterned beam of radiation is projected subsequently onto a number outer target portions of the substrate before the patterned beam is projected onto inner target portions of the substrate. Each subsequent outer target portion is spaced-apart from the outer target portion preceding that subsequent outer target portion.

The outer target portions are exposed before the inner target portions, so that the global heat build of the substrate is still relatively low during the exposure of the outer target portions. Consequently, the temperature of each outer target portion will have been raised only by a relatively small amount during the exposure of that target portion. The substrate temperature may further rise during illumination of subsequent inner target portions. The invention takes advantage of the recognition that the inner target portions expand less than the outer target portions under influence of the global heat build up. Therefore, the method according to the invention may further provide the advantage that both the inner and outer target portions may be illuminated by the projection beam with high precision.

In one embodiment, the patterned beam of radiation is projected onto all outer target portions of the substrate before the patterned beam is projected onto inner target portions of the substrate.

Thus, all outer target portions are illuminated by the projection beam when the global substrate temperature is still relatively low and the substrate has experienced relatively little expansion, so that all outer target portions may be exposed with high accuracy. After that, the inner target portions are illuminated, which also may be achieved with a desired high accuracy.

According to an embodiment of the invention, each subsequent outer target portion is located on a position which is the farthest away from the positions of any preceding outer target portions.

Therefore, each subsequent outer target portion is spaced-apart over a relatively large distance from any previously illuminated target portion, which leads to a relatively even spread of heat over the substrate during exposure to the projection beam. Because the heat can build up evenly, local heat build up may be kept at a low level, such that a high degree of projection accuracy may be achieved. For example, at least a number of the subsequent outer target portions may be located substantially opposite respective preceding outer target portions with respect to a substrate center.

According to a further aspect of the invention, there is provided a lithographic apparatus that includes an illumination system for providing a projection beam of radiation, and a support structure for supporting a patterning device. The patterning device serves to impart the projection beam with a pattern in its cross-section. The apparatus also includes a substrate table for holding a substrate, and a projection system for projecting the patterned beam onto a target portion of the substrate. The apparatus is arranged to carry out a method that includes patterning a beam of radiation; projecting the patterned beam of radiation onto a plurality of outer target portions of a substrate in a sequence in which each subsequent outer target portion is spaced-apart from a preceding outer target portion; and subsequent to projecting the patterned beam of radiation on the plurality of outer target portions, projecting the patterned beam of radiation onto an inner target portion of the substrate.

Consequently, this apparatus may provide the above-mentioned advantages. Particularly, the apparatus may produce devices accurately.

Furthermore, the invention relates to a device that is manufactured on such an apparatus and/or with such a device manufacturing method. Because the device is manufactured by the aforementioned method and/or by the aforementioned apparatus, the device may be manufactured precisely and be provided with, for example, relatively small features.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, et cetera. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" as used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein the substrate is immersed in or exposed to a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
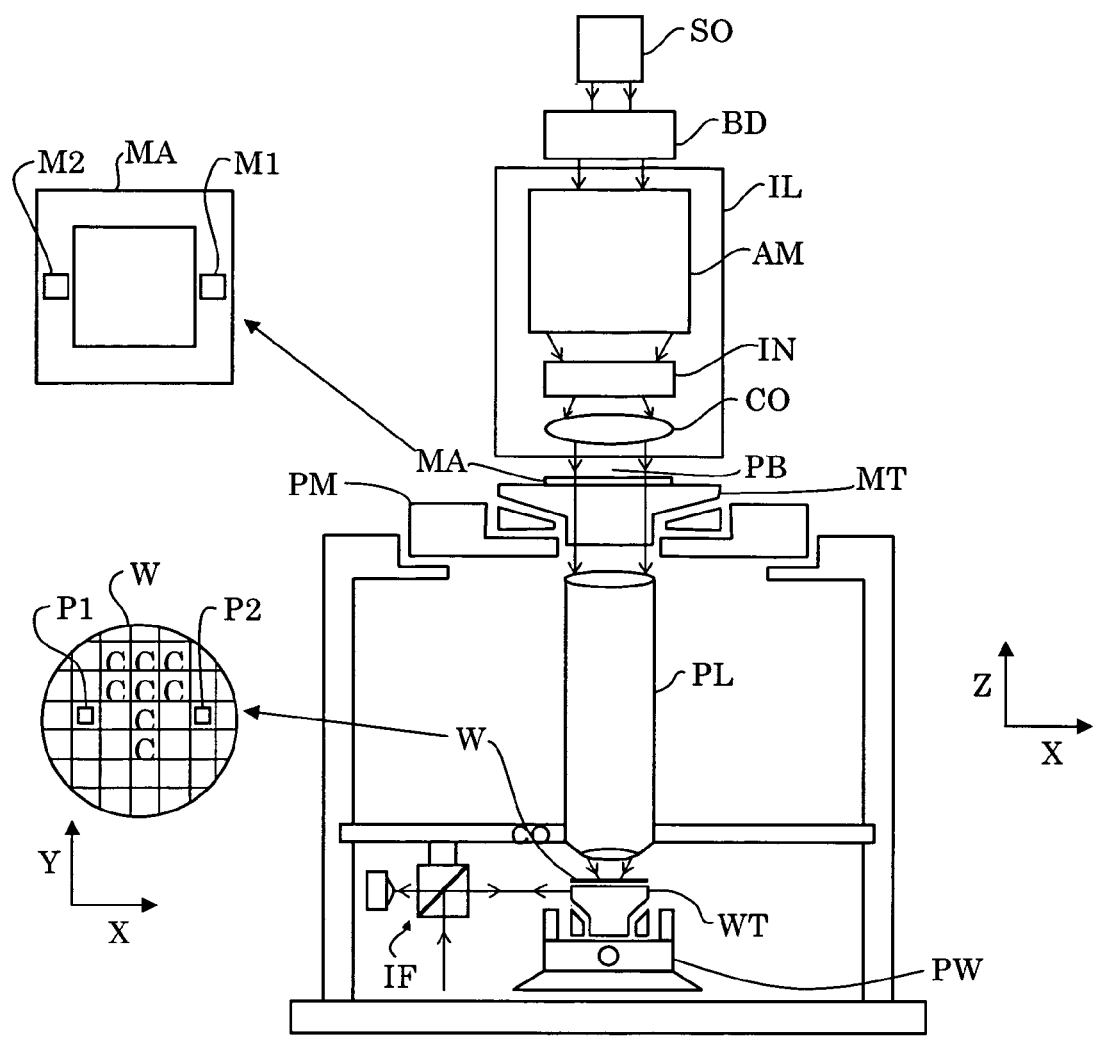
FIG. 1 depicts a lithographic apparatus according to an embodiment of the invention.
Figure 2:
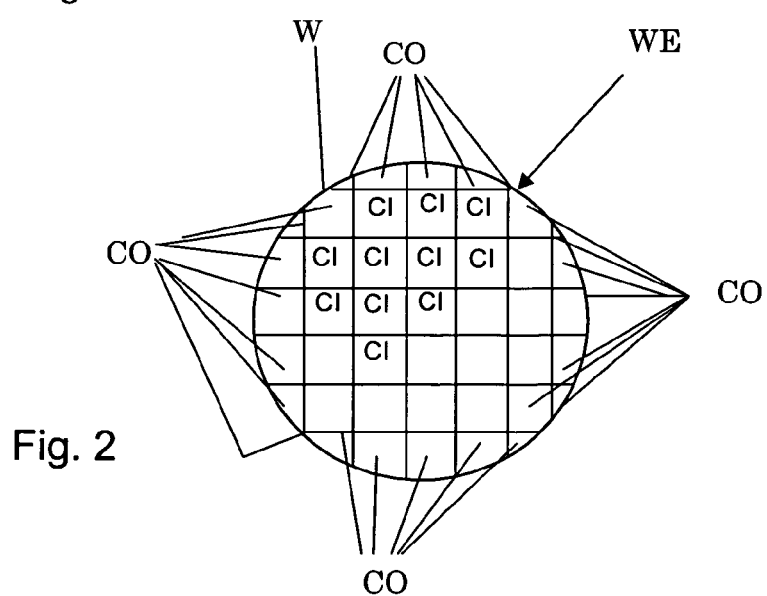
FIG. 2 shows a substrate in the lithographic apparatus of FIG. 1 in more detail.

FIG. 1 schematically depicts a lithographic apparatus according to a particular embodiment of the invention. The apparatus includes: an illumination system (illuminator) IL for providing a projection beam PB of radiation; a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist-coated wafer) W and connected to a second positioning device PW for accurately positioning the substrate with respect to item PL; and a projection system (e.g. a refractive projection lens) PL for imaging a pattern imparted to the projection beam PB by the patterning device MA onto target portions C of the substrate W. The target portions may include one or more dies or chips, and/or parts of one or more dies or chips. The term "table" as used herein can also be considered or termed as a "support." It should be understood that the term support or table broadly refers to a structure that supports, holds, or carries a patterning device, mask, or substrate.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus may be used in the following modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed. In each mode, the projection beam illuminates the substrate, leading to local and global heat build up on the substrate. The heat may be removed in different ways from the substrate, for example, by conducting the heat via the substrate holder from the substrate.

According to the present invention, a device manufacturing method is characterized in that a substrate W is provided, a projection beam of radiation PB is provided using an illumination system IL, and a patterning device MA is used to impart the projection beam PB with a pattern in its cross-section. The patterned beam of radiation PB is projected subsequently onto a plurality of outer target portions CO of the substrate W before the patterned beam is projected onto inner target portions CI of the substrate W. In this case, "radiation" and "beam" encompass all types of electromagnetic radiation, including ultraviolet (UV) radiation, extreme ultra-violet (EUV) radiation (e.g. having a wavelength in the range of 5-20 nm), as well as particle beams, such as ion beams or electron beams. Each subsequent outer target portion $CO_{i+1}$ is spaced-apart from the outer target portion $CO_i$ preceding that subsequent outer target portion $CO_{i+1}$. Herein, i+1 is the number of the subsequent target portion and i the number of the preceding target portion, whereas i=[1, 2, 3, . . . n] is the number in the exposure sequence of the total of n outer target portions.

As is shown in FIGS. 2-6, peripheral outer target portions CO may include the edge WE of the substrate W: Therefore, during substrate exposure, the projection beam PB is only partly projected onto these outer target portion CO, as has been illustrated in FIGS. 2-6 by the outer squares depicting outer target portion exposure areas. As shown, the inner target portions CI are surrounded by the outer target portions CO and all lie fully on the substrate W.

Figure 7:
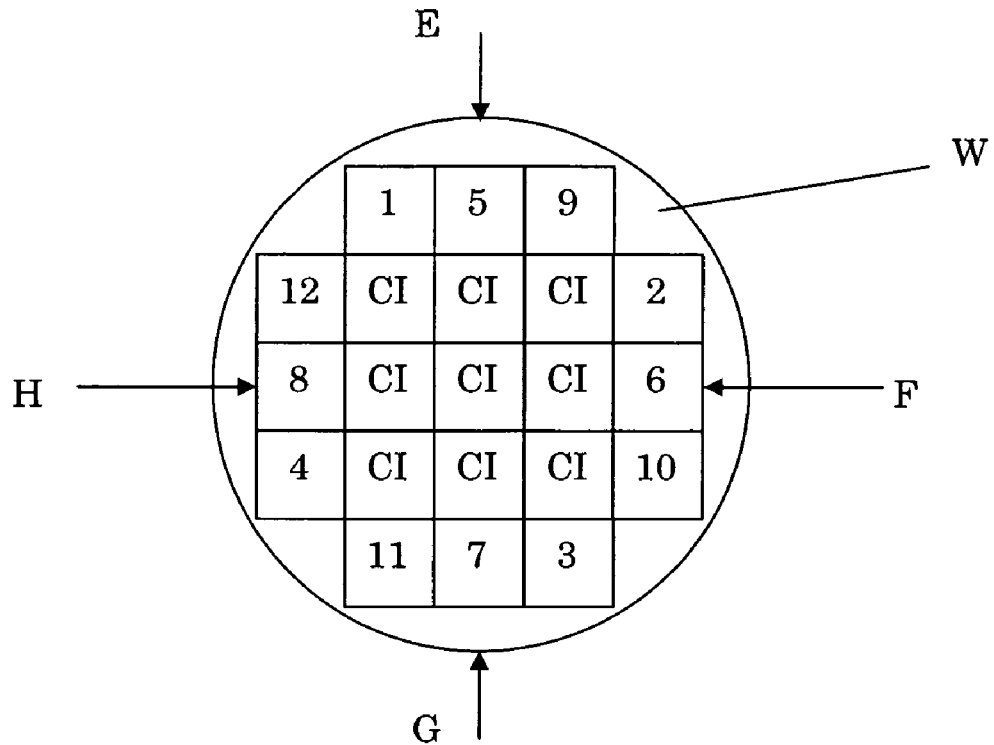
FIG. 7 shows a fifth embodiment of the present invention.

FIG. 7 shows that each outer target portion CO may alternatively be located near the substrate edge WE on the substrate W. In this embodiment, the projection beam PB may be projected fully onto each outer target portion CO.

According to the invention, the outer target portions CO are exposed to the projection beam in a certain advantageous sequence, so that they experience relatively little thermal expansion due to heat build up. In the embodiments shown in FIGS. 3-7, each subsequent outer target portion $CO_{i+1}$ is spaced-apart from the outer target portion $CO_i$ preceding that subsequent outer target portion $COi+_1$, as is explained below.

Figure 3:
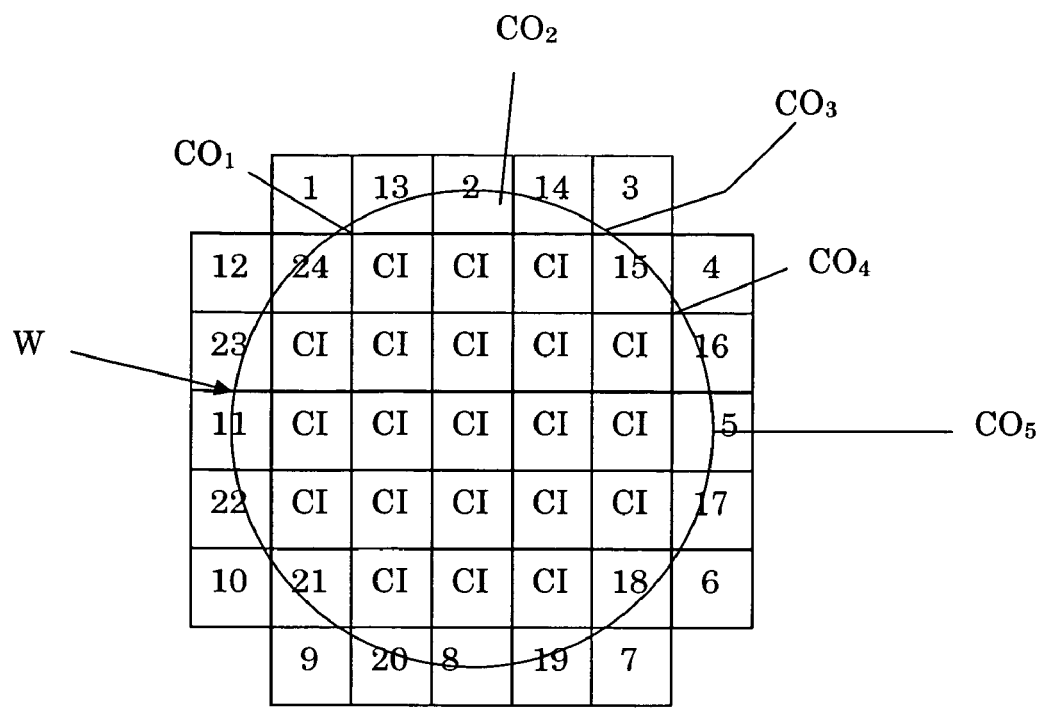
FIG. 3 shows a first embodiment of the present invention.

FIG. 3 shows a first embodiment, in which each subsequent outer target portion $CO_{i+1}$ is spaced-apart from the previous outer target portion $CO_i$ by one or two outer target portions. In the present embodiment, the substrate W includes, for example, n=24 different edge target portions. The exposure sequence as shown in FIG. 3 may have the advantage that the edge WE of the substrate W may be exposed to the projection beam PB relatively fast, because the projection beam PB may be directed around the substrate edge WE, skipping only small distances between subsequent target portions along the way. Because the subsequent outer target portions CO are spaced-apart, they may experience relatively little local heating, so that the substrate edge can be exposed relatively precise. After the exposure of the substrate edge WE, the remaining part of the substrate, including inner target portions CI, is exposed. Therefore, a global heating up of the substrate W as a result of the exposure of the inner target portions CI will not hamper the precision of the exposure of the outer target portions.

Figure 4:
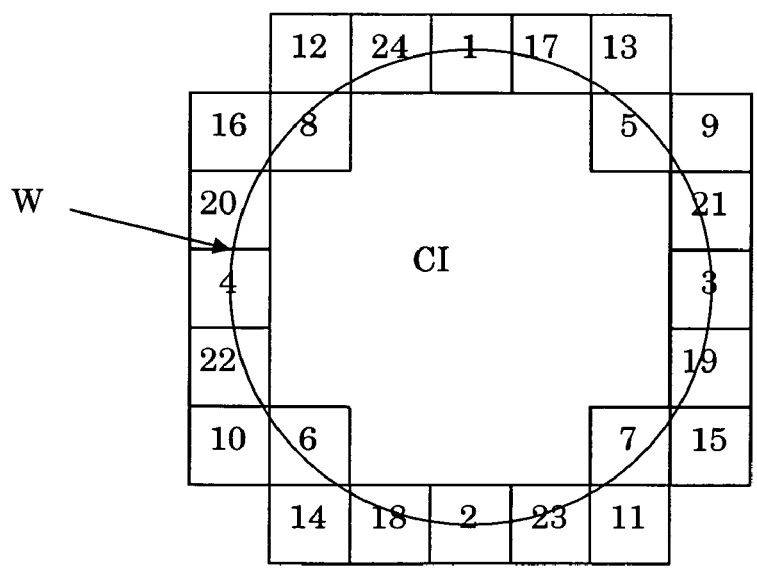
FIG. 4 shows a second embodiment of the present invention.

FIG. 4 shows a second embodiment, which differs from the first embodiment in that the subsequent outer target portions CO are spaced apart over a relatively large distance. In this embodiment, each subsequent outer target portion $CO_{i+1}$ is located on an outer target portion position that is the farthest away from the positions of any preceding outer target portion CO, when viewed in a peripheral direction. Again, the outer target portions CO enclose a number of inner target portions CI. Particularly, the second outer target portion $CO_2$ lies opposite the first outer target portion CO, with respect to a substrate center. The third and fourth outer target portions $CO_3$, $CO_4$ are both located opposite each other, halfway between the two preceding target portions $CO_1$ and $CO_2$ on the substrate edge WE. The sequence continues, with the fifth outer target portion $CO_5$ between the first and third target portions $CO_1$, $CO_3$, etc. In particular, each subsequent outer target portion $CO_{i+1}$ is located over at least a quarter of a substrate circumference from the previous target portion $CO_i$, when viewed in a circumferential direction. Therefore, an undesired high local thermal energy build up may be prevented. In this way, the substrate may be heated up relatively evenly, further improving the illumination accuracy.

Figure 5:
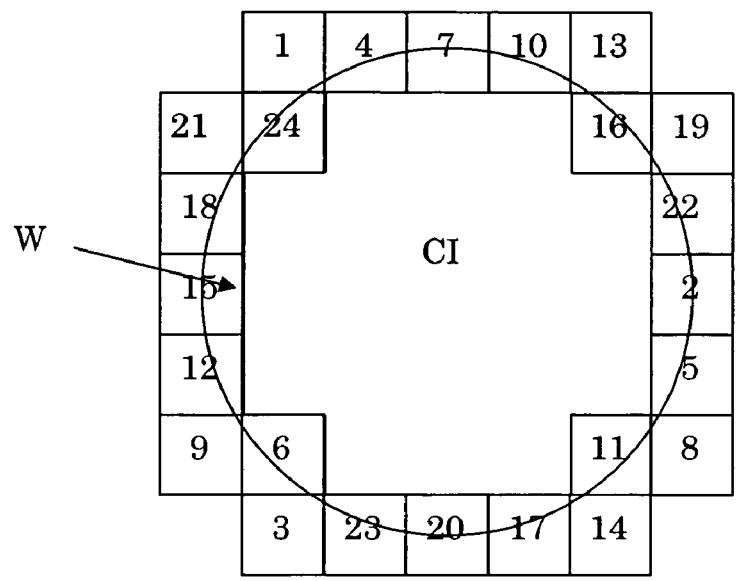
FIG. 5 shows a third embodiment of the present invention.

In the third embodiment, which is depicted in FIG. 5, the distance between two subsequent outer target portions is about one third of the substrate circumference, when viewed in a circumferential direction, which may also lead to a relatively low local heat build up and a relatively even temperature distribution. In FIG. 5, the fourth outer target portion is located next to the first target portion. Alternatively, a sequence may be used that is similar to the one depicted in FIG. 4, in which the fourth outer target portion is located in the circumferential middle of the first and second target portion, the fifth in the circumferential middle between the first and third, and so on.

Figure 6:
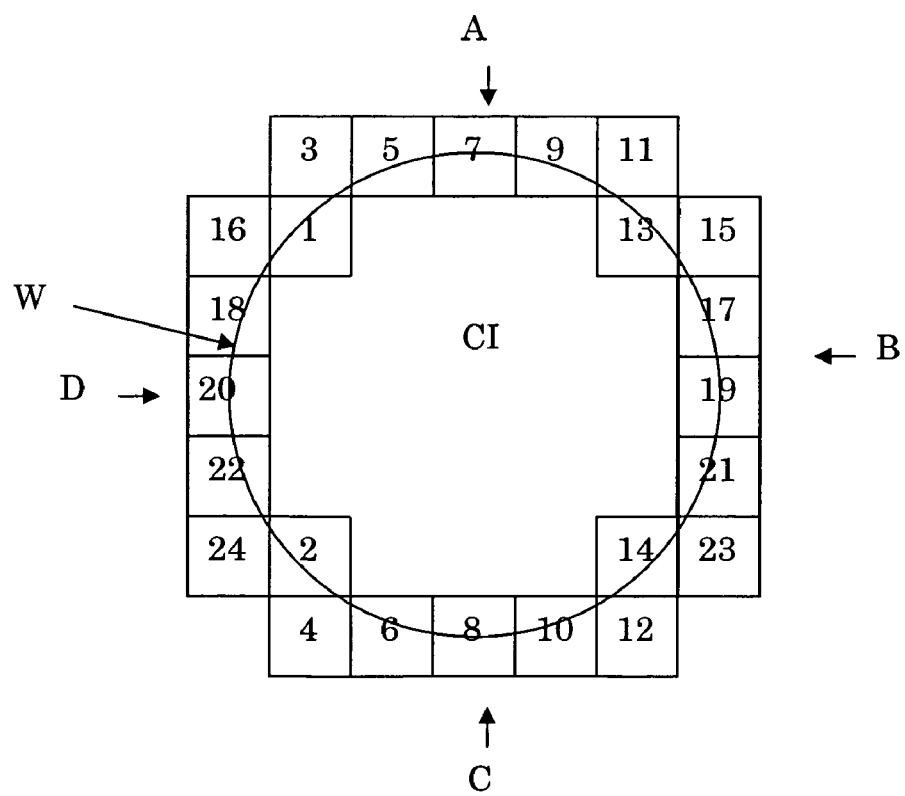
FIG. 6 shows a fourth embodiment of the present invention.

The fourth embodiment is shown in FIG. 6. In this embodiment, the outer target portions CO are divided into four groups A, B, C, D. The first group A and third group C are opposite to each other. The same holds for the remaining second and fourth group B, D. The first and third group A, C are exposed first, with subsequent target portions CO being on opposite sides with respect to the substrate center, followed by the second and fourth group B, D.

FIG. 7 shows a fifth embodiment in which the outer target portions, onto which the projection beam is projected, are fully located on the substrate W. The exposure sequence used in the fifth embodiment is such that each subsequent outer target portion $CO_{i+1}$ is spaced-apart from the previous target portion $C_i$. The outer target portions are divided into four groups E, F, G, H. During exposure, one target portion of each of these groups E, F, G, H is selected in sequence until the projection beam has been projected onto all outer target portions.

Figure 8:
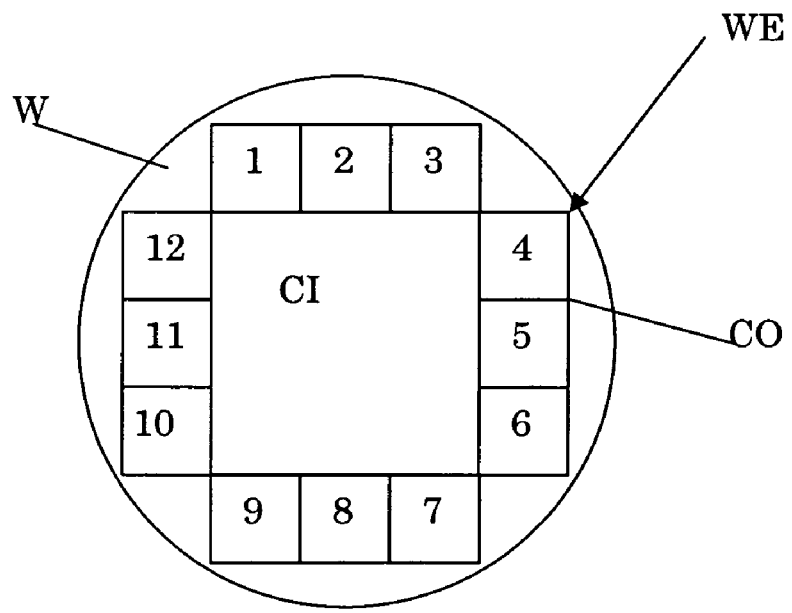
FIG. 8 shows a sixth embodiment of the present invention.

FIG. 8 depicts the exposure sequence of an embodiment of a device manufacturing method according to a further aspect of the invention, in which a substrate W is provided, and an optical projection beam of radiation is provided using an illumination system. In this embodiment, referring to "optical projection beam of radiation", the terms "radiation" and "beam" encompass all types of electromagnetic radiation, including ultraviolet (UV) radiation (e.g. having a wavelength of 365, 248, 193, 157 or 126 nm) and extreme ultraviolet (EUV) radiation (e.g. having a wavelength in the range of 5-20 nm), but not charged particle beams such as ion beams or electron beams. According to the present further aspect of the invention, a patterning device is used to impart the projection beam with a pattern in its cross-section, and the patterned beam of radiation is projected onto all outer target portions of the substrate before the patterned beam is projected onto inner target portions CI of the substrate. A plurality of outer target portions $CO_i$ (i=1, 2, 3, . . . , 12) is shown. The outer target portions CO surround a number of inner target portions CI. The outer target portions may be exposed in various sequences by the optical beam. In FIG. 8, each outer target portion CO is located near the substrate edge WE on the substrate W, such that the projection beam PB can be projected fully onto each outer target portion CO. However, some or all outer target portions may also include part of the substrate edge WE, so that only part of the projection beam is used to illuminate those outer target portions. As is shown in FIG. 8, the subsequent outer target portions CO may lie next to each other. This may provide the advantage to the optical lithography method that the substrate W will have been heated relatively little globally during the exposure of the outer target portions CO, so that exposure of these target portions may be accurate. The subsequent outer target portions may be illuminated relatively fast by the projection beam.

One benefit of the invention is that overlay problems may be diminished and devices may be made with high accuracy. Particularly, in the described sequence, each subsequent outer target portion on which the projection beam is to be projected, is spaced-apart from each outer target portion that has just been illuminated by the projection beam, so that a relatively small local heat build up is generated during the exposure of the outer target portions. This reduction of heat build up lowers substrate expansion levels, and results in benefits to overlay and alignment of substrate target portions.

The invention also provides a device manufacturing method, in which a substrate is provided, a beam of radiation is provided using an illumination system, wherein the patterning device is used to impart the beam of radiation with a pattern in its cross-section. The patterned beam of radiation is projected subsequently onto at least one target portion of the substrate. The substrate is additionally heated, such that the substrate has a relatively constant heat load. Herein, the term "constant" means constant in time and/or position. The term "additionally" means additionally to the illumination of the projection beam.

The invention also provides a lithographic apparatus that includes an illumination system for providing a beam of radiation, and a support structure for supporting a patterning device. The patterning device serves to impart the beam of radiation with a pattern in its cross-section. The apparatus also includes a substrate table for holding a substrate, and a projection system for projecting the patterned beam onto a target portion of the substrate. The apparatus is provided with an additional heating system for providing additional heating of the substrate.

The complementary heating is preferably provided by complementary illuminating the substrate using an additional illumination system. The additional heating, for example illumination, is supposed to heat the substrate without influencing, for example, resist patterning. Therefore, it may be advantageous in the embodiment where additional illumination is used to use radiation for which the resist is insensitive, for example, infrared radiation, to additionally illuminate the substrate. A feed-forward system may control the dose of the complementary illumination system, based on the (known) heat that is produced by the patterning beam. The complementary illumination system may include, for example, a laser and/or a 'classical' radiation source. The complementary illumination system may, for example, irradiate the whole substrate surface uniformly, the slit uniformly, the slit in a patterned fashion or regions around the slit. Herein, the slit is the actual line of light projected onto the substrate. Other complementary illumination strategies are also possible. Furthermore, this method may also be use for lenses, mirrors and/or the reticle.

An advantage of the complementary heating is that the temperature of the substrate may be kept relatively stable during the lithographic process. Therefore, the thermal expansion of the substrate may be kept constant in time and/or uniformly in position. Another advantage is that the substrate temperature may be controlled relatively easy. As a result, overlay errors may be minimized, because all substrates may be exposed at the same temperature.

While specific embodiments of the invention have been described above, it will be appreciated that the invention may be practiced otherwise than as described. The description is not intended to limit the invention.

For example, the outer target portions CO may include one or more rows of target portions near the and/or on the edge of the substrate W, for example, a plurality of concentric rings of target portions CO for embodiments in which the substrate W is circle shaped.

Furthermore, the inner target portions CI may be illuminated by the projection beam in several ways. For example, each subsequent inner target portion may be located next to the previously illuminated inner target portion. However, from heat distribution point of view, it may also be advantageous when each subsequent inner target portion CI is spaced-apart from the preceding inner target portion, as was described above in the first embodiment of the invention concerning the outer target portions CO. For example, each preceding inner target portion and subsequent inner target portion may be spaced-apart by at least one further inner portion. Each subsequent inner target portion may be located on a position which is the farthest away from the positions of any preceding inner target portions Also, at least a number of the subsequent inner target portions may be located substantially opposite respective preceding outer target portions with respect to a substrate center. The inner target portions CI may be illuminated ring-by-ring, in a radially or spirally inward substrate direction.

Combinations of the aforementioned methods may be used to illuminate the outer and/or inner target portions.

What is claimed is:

1. A device manufacturing method comprising:
   patterning a beam of radiation;
   projecting the patterned beam of radiation onto a plurality of outer target portions of a substrate, one outer target portion at a time, and moving the substrate in between projections in a sequence in which each subsequent outer target portion is spaced-apart from a preceding outer target portion by at least one further target portion; and
   subsequent to said projecting the patterned beam of radiation on the plurality of outer target portions, projecting the patterned beam of radiation onto an inner target portion of the substrate, the plurality of outer target portions surrounding the inner target portion,
   wherein the patterned beam of radiation is projected onto all said outer target portions of the substrate before the patterned beam is projected onto the inner target portion of the substrate.

2. A method according to claim 1, wherein said each subsequent outer target portion is located at a position that is the farthest away from a position of any said preceding outer target portion.

3. A method according to claim 1, wherein a plurality of said subsequent outer target portions are located substantially opposite respective preceding outer target portions with respect to a substrate center.

4. A method according to claim 1, wherein some of said plurality of said outer target portions are located near an edge of said substrate.

5. A method according to claim 1, wherein some of said plurality of said outer target portions comprise part of an edge of said substrate.

6. A method according to claim 1, wherein said beam of radiation is an optical beam.

7. A method according to claim 1, wherein said projecting the patterned beam of radiation on the plurality of outer target portions forms a closed outer ring of outer target portions prior to said projecting the patterned beam of radiation onto the inner target portion.

8. A method according to claim 1, wherein said projection beam is a charged particle beam.

9. A method according to claim 1, wherein said inner target portion comprises a plurality of inner target sub-portions, and said projecting the patterned beam of radiation onto the inner target portion of the substrate comprises projecting the patterned beam of radiation onto said plurality of inner target sub-portions such that each subsequent inner target sub-portion is spaced-apart from a preceding inner target sub-portion.

10. A device manufactured by the method according to claim 1.

11. A device manufacturing method comprising:
    patterning a beam of radiation;
    projecting the patterned beam of radiation onto a plurality of outer target portions of a substrate, one outer target portion at a time, and moving the substrate in between projections, the plurality of outer target portions comprising an edge of the substrate; and
    projecting the patterned beam of radiation onto an inner target portion of the substrate after said projecting the patterned beam of radiation onto the plurality of outer target portions of the substrate is completed, the plurality of outer target portions surrounding the inner target portion.

12. A method according to claim 11, wherein said inner target portion comprises a plurality of inner target sub-portions, and said projecting the patterned beam of radiation onto the inner target portion of the substrate comprises projecting the patterned beam of radiation onto said plurality of inner target sub-portions, one inner target portion at a time, and moving the substrate in between projections such that each subsequent inner target sub-portion is spaced-apart from a preceding inner target sub-portion.

13. A device manufactured by the method according to claim 11.

14. A lithographic apparatus comprising:
    a support structure for supporting a patterning device, the patterning device serving to impart a beam of radiation with a pattern in its cross-section;
    a substrate table for holding a substrate; and
    a projection system for projecting the patterned beam onto a target portion of the substrate,
    wherein said apparatus is arranged to carry out a method comprising
    (i) patterning the beam of radiation with the patterning device;

(ii) projecting the patterned beam of radiation onto a plurality of outer target portions of the substrate with the projection system, one outer target portion at a time, and moving the substrate with the substrate table in between projections in a sequence in which each subsequent outer target portion is spaced-apart from a preceding outer target portion by at least one further target portion; and (iii) projecting the patterned beam of radiation onto an inner target portion of the substrate after the patterned beam of radiation is projected onto all said outer target portions of the substrate, the plurality of outer target portions surrounding the inner target portion.

15. A device manufactured by the apparatus according to claim 14.

16. A lithographic apparatus comprising:

a support structure for supporting a patterning device, the patterning device serving to impart a beam of radiation with a pattern in its cross-section;

a substrate table for holding a substrate; and a projection system for projecting the patterned beam onto a target portion of the substrate, wherein said apparatus is arranged to carry out a method comprising (i) patterning a beam of radiation;

(ii) projecting the patterned beam of radiation onto a plurality of outer target portions of a substrate, one outer target portion at a time, and moving the substrate in between projections, the plurality of outer target portions comprising an edge of the substrate; and (iii) projecting the patterned beam of radiation onto an inner target portion of the substrate after said projecting the patterned beam of radiation onto the plurality of outer target portions of the substrate is completed, the plurality of outer target portions surrounding the inner target portion.

17. A device manufactured by the apparatus according to claim 16.

* * * * *